US006821822B1

United States Patent
Sato

(10) Patent No.: US 6,821,822 B1
(45) Date of Patent: Nov. 23, 2004

(54) METHOD OF MANUFACTURING SEMICONDUCTOR DEVICE, MOLDING DEVICE FOR SEMICONDUCTOR DEVICE, AND SEMICONDUCTOR DEVICE

(75) Inventor: Akira Sato, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/424,500

(22) PCT Filed: Mar. 25, 1999

(86) PCT No.: PCT/JP99/01520

§ 371 (c)(1),
(2), (4) Date: Feb. 22, 2000

(87) PCT Pub. No.: WO99/50908

PCT Pub. Date: Oct. 7, 1999

(30) Foreign Application Priority Data

Mar. 26, 1998 (JP) .......................... 10-079874

(51) Int. Cl.[7] .................. H01L 21/44; H01L 21/48; H01L 21/50
(52) U.S. Cl. ................. 438/127; 438/25; 438/26; 438/51; 438/64; 438/121; 438/122; 438/125; 257/678
(58) Field of Search ............... 438/121–127, 438/25, 26, 51, 64, 597, 610, 660; 257/678

(56) References Cited

U.S. PATENT DOCUMENTS

| 4,888,307 A | | 12/1989 | Spairisano et al. | |
|---|---|---|---|---|
| 5,157,475 A | * | 10/1992 | Yamaguchi | ............ 357/68 |
| 5,289,033 A | * | 2/1994 | Asami et al. | ............ 257/676 |
| 5,498,902 A | * | 3/1996 | Hara | ............ 257/686 |
| 5,633,529 A | * | 5/1997 | Otsuki | ............ 257/666 |
| 5,693,984 A | * | 12/1997 | Ootsuki | ............ 257/796 |
| 5,733,802 A | * | 3/1998 | Inoue et al. | ............ 438/127 |
| 6,118,184 A | * | 9/2000 | Ishio et al. | ............ 257/787 |
| 6,133,623 A | * | 10/2000 | Otsuki et al. | ............ 257/666 |
| 6,265,762 B1 | * | 7/2001 | Tanaka et al. | ............ 257/676 |

FOREIGN PATENT DOCUMENTS

| JP | A-6-53264 | 2/1994 | | |
|---|---|---|---|---|
| JP | A-6-177268 | 6/1994 | | |
| JP | A-6-244312 | 9/1994 | | |
| JP | A-7-60782 | 3/1995 | | |
| JP | A-9-76282 | 3/1997 | | |
| JP | A-9-260410 | 10/1997 | | |
| JP | 11-111746 | * 10/1997 | ........... | H01L/21/56 |
| JP | 2001-110830 | * 10/1997 | ........... | H01L/21/56 |

* cited by examiner

Primary Examiner—Matthew Smith
Assistant Examiner—Granvill D. Lee
(74) Attorney, Agent, or Firm—Oliff & Berridge, PLC

(57) ABSTRACT

A semiconductor assembly (10) in which a semiconductor chip (12) is secured to a die pad (14) is placed in a cavity (38). A support pin (42) which is able to enter into or be pulled out of the cavity (38) is provided in a lower mold (36). The support pin (42) is provided on the axis of a mold gate provided in the lower mold (36) and can be moved up and down by a servomotor (48). The support pin (42) comes in contact with the bottom of the die pad (14) to support the semiconductor assembly (10), thereby preventing the semiconductor assembly (10) from tilting or moving up and down due to the flow of the resin injected into the cavity (38).

26 Claims, 6 Drawing Sheets

FIG. I

METHOD OF MANUFACTURING SEMICONDUCTOR DEVICE, MOLDING DEVICE FOR SEMICONDUCTOR DEVICE, AND SEMICONDUCTOR DEVICE

This application is a 371 of PCT/JP99/01520 filed Mar. 25, 1999.

TECHNICAL FIELD

The present invention relates to a method of manufacturing a semiconductor device, a molding device for a semiconductor device, and a semiconductor device.

BACKGROUND ART

A semiconductor device manufactured by securing a semiconductor chip to a die pad provided in a lead frame with an adhesive, connecting leads of the lead frame to electrodes of the semiconductor chip using gold wires to form a semiconductor assembly, placing the semiconductor assembly in a cavity, and curing a resin injected into the cavity so as to cover the semiconductor assembly has been known. FIG. 9 is a plan view showing part of such a semiconductor assembly.

In a semiconductor assembly 10 shown in FIG. 9, a semiconductor chip 12 is secured to a die pad 14 which has a square or rectangular shape. Suspension leads 16 are provided to connect four corners of the die pad 14 to a lead frame 18 and support the die pad 14. The lead frame 18 comprises a plurality of leads 20 between the suspension leads 16, and the leads 20 are connected to the terminals of the semiconductor chip 12 by wires (gold wires) 22.

This semiconductor assembly 10 is placed in a cavity with the leads 20 sandwiched between upper and lower molds and sealed with a resin injected into the cavity from a resin injection port of the mold which is provided at one corner of the die pad 14.

However, since the lead frame 18 supports the die pad 14 through the thin, narrow suspension leads 16, when the resin is injected into the cavity in which the semiconductor assembly 10 is placed, the semiconductor assembly 10 may tilt in a direction of the resin injection (in a direction along the axis of the resin injection port) or move up and down due to the flow of the injected resin in the cavity 24, as shown in FIG. 10. When manufacturing a semiconductor device having a total thickness "t" of 1 mm, 1.4 mm, or the like, the slight tilting or movement of the semiconductor assembly 10 may cause the die pad 14 or wires 22 to be in contact with the mold when the semiconductor assembly 10 is sealed, resulting in defective products in which the die pad 14 or wires 22 is exposed from the surface of the cured resin.

Therefore, conventional methods of eliminating such defects include a method of adjusting the height of the wires 22 in a wire bonding step in which the semiconductor chip 12 is connected to the leads 20 with the wires 22, or a method of changing molding conditions in the injection of the resin into the cavity 24. However, defective products with the die pad 14 or wires 22 exposed on the surface could not be eliminated due to fluctuation in processing or the like. Because the molding conditions have been adjusted based on the results of previous molding, countermeasures to a change in materials tend to delay and the degree of adjustment of the molding conditions tends to be too small to adequately remove the above defect.

The present invention has been achieved to solve the above problems of the prior art and has an objective of eliminating the defects in the molding step of resin sealing.

DISCLOSURE OF THE INVENTION

In order to achieve the above-described objective, a method of manufacturing a semiconductor device according to the present invention comprises a step of placing a semiconductor assembly in which a semiconductor chip is secured to a die pad of a lead frame in a cavity of a mold and sealing the semiconductor assembly with a resin injected into the cavity, wherein at least one support pin positioned substantially on the axis of a resin injection port of the mold is caused to come in contact with the semiconductor assembly, and wherein the resin injected into the cavity from the resin injection port is cured after the support pin has been pulled into the mold.

According to the present invention, the semiconductor assembly does not tilt or move due to the flow of the resin because the resin is injected while the semiconductor assembly is supported by the support pin. Therefore, the die pad or wires are not in contact with the mold, thereby eliminating defects such as exposure of the die pad or wires from the semiconductor assembly sealed with the resin. Moreover, since the support pins are pulled out of the mold cavity before the injected resin is cured, the semiconductor assembly is not exposed from holes which are formed in the points where the support pins have existed.

The semiconductor chip is not damaged if the support pin comes in contact with the die pad. The semiconductor assembly is supported more securely by arranging a plurality of support pins substantially on the axis of the resin injection port, thereby further reducing the tilting of the semiconductor assembly and the like. If pressure is applied to the semiconductor assembly by the support pins to move the assembly in a direction away from the previous position of the contact portion of the support pins, the support pins are pushed toward the mold by the semiconductor assembly due to the elasticity of the wires connecting the leads of the lead frame to the semiconductor chip and the suspension leads. Therefore, the semiconductor assembly is not lifted up by the resin even if the resin flows into the cavity under high pressure.

The semiconductor assembly may be placed in the cavity with the die pad either in the upper side or the lower side, depending on the client's request. If the semiconductor assembly is placed with the die pad in the lower side, the support pin is preferably provided on the lower mold. If the semiconductor assembly is placed with the die pad in the upper side, the support pin is preferably provided on the upper mold. If the support pins are in contact with both the top and the bottom of the semiconductor assembly so as to sandwich the semiconductor assembly, the mispositioning of the semiconductor assembly can be more reliably prevented when injecting the resin. If a pair of support pins come in contact with the suspension leads which connect the die pad to the lead frame, the interval between the support pins becomes longer, whereby the semiconductor assembly can be securely supported.

In the method of manufacturing a semiconductor device according to the present invention, a heat radiator placed in a cavity of a mold is supported by at least one support pin provided substantially on the axis of a resin injection port; the mold is closed after a die pad of a lead frame to which a semiconductor chip is secured is placed on the heat radiator; and after the support pin is pulled into the mold, a resin injected into the cavity from the resin injection port is cured. According to the present invention, the heat radiator can be provided to the semiconductor assembly at the time of molding with the resin (sealing with the resin), thereby simplifying the manufacturing process.

If the heat radiator is supported by the support pin that is held by a recess formed on a lower surface of the heat radiator for preventing the heat radiator from moving, displacement of the heat radiator at the time of placing the semiconductor assembly on the heat radiator can be prevented, whereby the position of the semiconductor assembly on the heat radiator can be precisely determined. In this case, a plurality of support pins may be provided substantially on the axis of the resin injection port.

The molding device for carrying out the method of manufacturing the semiconductor device comprises: a mold which is capable of being opened or closed and is provided with a cavity for placing a semiconductor assembly which comprises a semiconductor chip secured to a die pad of a lead frame; a resin injection port provided to the mold for injecting a resin into the cavity; at least one support pin provided in the cavity substantially on the axis of the resin injection port such that the support pin is able to enter into or be pulled out of the cavity to come in contact with the semiconductor assembly in the cavity; and an actuator which moves the support pin in a direction of the axis of the support pin. Therefore, the semiconductor assembly does not tilt or move up and down, thereby eliminating defects such as exposure of the die pad or wires.

The semiconductor assembly can be securely prevented from tilting by providing a plurality of support pins substantially on the axis of the resin injection port. The support pins may be provided in either the upper mold or the lower mold as required. The support pins may be provided in both the upper and lower mold to sandwich the semiconductor assembly. Alternatively, the support pin may be provided at a position corresponding to the die pad so as to support the die pad. Instead, a pair of support pins may be provided substantially on the axis of the resin injection port, and the support pins may be placed at positions corresponding to suspension leads which connect the die pad of the semiconductor assembly placed in the cavity to the lead frame to support the suspension leads. If a servomotor is used as the actuator which moves the support pins in and out of the cavity, the vertical position of the support pin, the speed of pulling the support pin into the mold, operation mode, and the like can be optionally set. This ensures use of various types of molds with ease and prevents the formation of bubbles and the like in the resin at the time of pulling the support pin. A semiconductor device according to the present invention can be manufactured by the method of any one of Claims 1 to 11. Therefore, defective products such as one with an exposed die pad or wires can be eliminated.

BEST MODE FOR CARRYING OUT THE INVENTION

A preferred embodiment of a method of manufacturing a semiconductor device, a molding device for a semiconductor device, and a semiconductor device according to the present invention will be described in more detail with reference to the drawings. Description of the parts described in the above prior art is omitted by using the same symbols.

Figure 1:
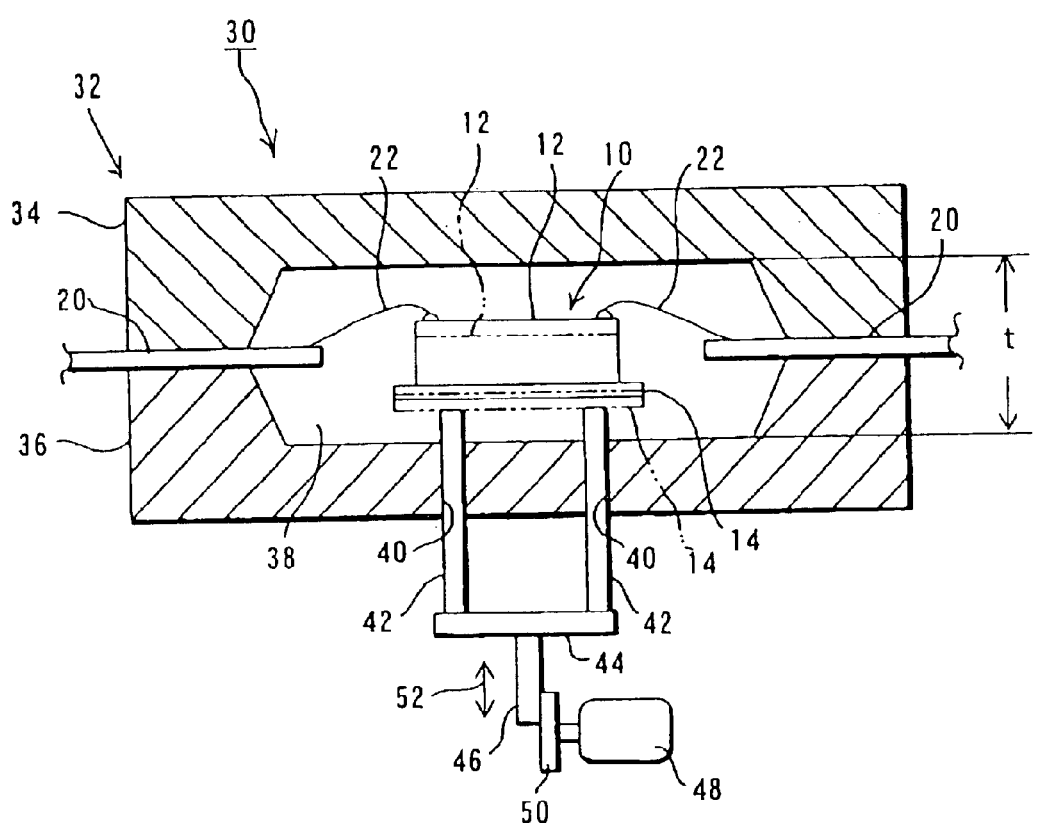
FIG. 1 illustrates the molding device for a semiconductor device according to the first embodiment of the present invention.

FIG. 1 illustrates a molding device for a semiconductor device according to a first embodiment of the present invention. In FIG. 1, a molding device 30 comprises a mold 32. The mold 32 consists of an upper mold 34 and a lower mold 36. The upper mold 34 and the lower mold 36 hold leads 20 of a semiconductor assembly 10 together and form a cavity 38 in which the semiconductor assembly 10 is placed. A pair of through-holes 40 is formed in the lower mold 36, and support pins 42 which pass through the lower mold 36 using the through-holes 40 and are capable of moving in and out of the cavity 38 are provided.

Figure 2:
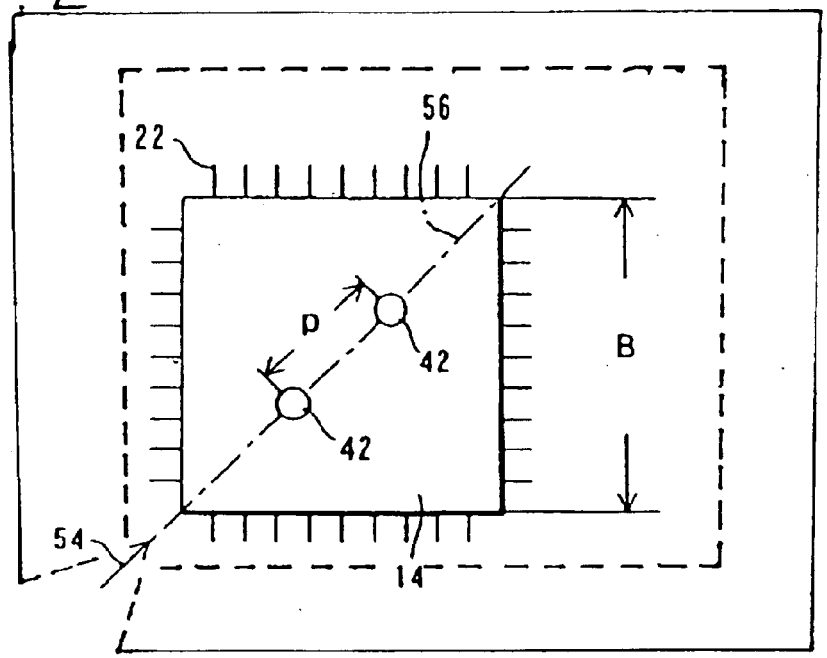
FIG. 2 illustrates the position of the support pin according to the embodiment of the present invention.

The support pins 42 are provided at a position corresponding to a die pad 14 of the semiconductor assembly 10 placed in the cavity 38 to come in contact with the die pad 14. The lower ends of the support pins 42 are secured to a connecting member 44 to move up and down together with the connecting member 44. A rod 46 is connected to the bottom of the connecting member 44. The lower end of the rod 46 is engaged to a front cam 50 which is rotated by a servomotor 48 used as an actuator, to move up and down by the rotation of the front cam 50, as shown by an arrow 52. The support pins 42 are arranged on an axis 56 of a mold gate 54 formed in the lower mold 36 as a resin injection port as shown in FIG. 2. Specifically, the support pins 42 are arranged on the axis of the resin injection port in a plan view. The support pins 42 are provided so as to move in the direction intersecting the axis of the resin injection port.

Figure 3:
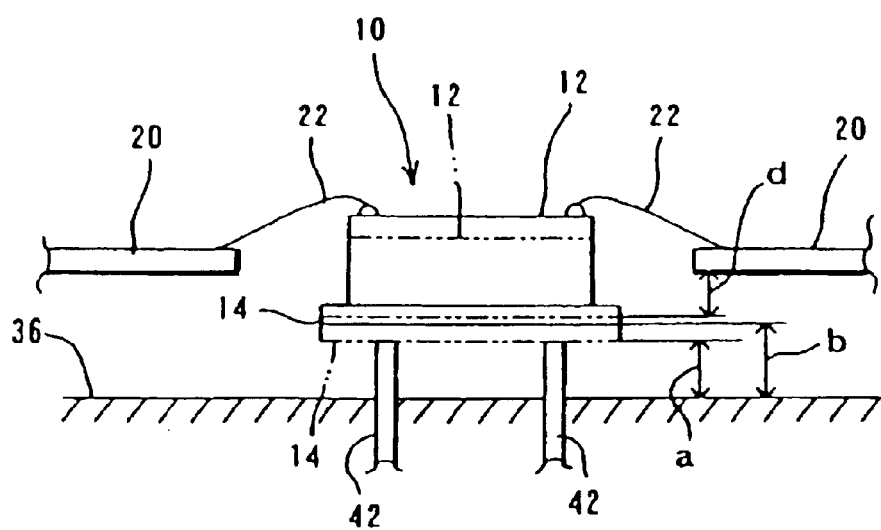
FIG. 3 illustrates the semiconductor assembly supported by the support pin according to the embodiment of the present invention.

In this embodiment, the die pad 14 is a square with a side length B of 9.5 mm, and an interval "p" between the support pins 42 is set at 6.5 mm. In the semiconductor assembly 10, a so-called depressing amount, specifically, an interval between the bottom of the lead 20 and the top of the die pad 14 shown in FIG. 3 is set larger than usual. If the total thickness "t" of the semiconductor device sealed with the resin is 1 mm (see FIG. 1), an interval "a" between the bottom of the die pad 14 shown by a dot-dot-dash line in FIG. 3 and the surface of the cavity of the lower mold 36 when the semiconductor assembly 10 is placed in the lower mold 36 is set at 0.175 mm. The support pins 42 is in contact with the bottom of the die pad 14 to push up the die pad 14 as shown by the solid line in FIG. 3. In this embodiment, an interval "b" between the bottom of the die pad 14 pushed up by the support pins 42 and the surface of the cavity of the lower mold 36 is set at from 0.26 to 0.28 mm.

Figure 4:
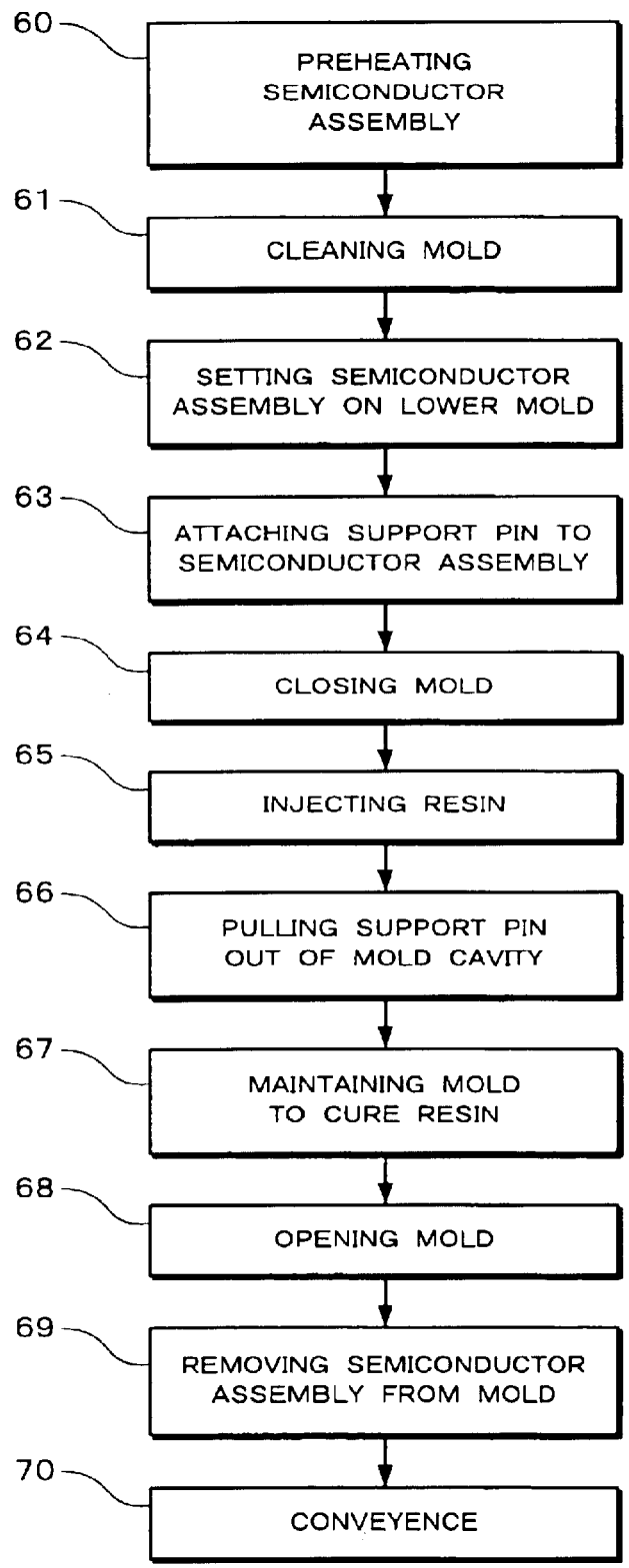
FIG. 4 is a block diagram illustrating a method of manufacturing a semiconductor device according to the embodiment of the present invention.

FIG. 4 is a block diagram illustrating a manufacturing process for a semiconductor device using the molding device shown in FIG. 1. The semiconductor assembly 10 in which terminals of the semiconductor chip 12 and the leads 20 of the lead frame are connected by wires 22 is preheated at about 165° C. in order to improve affinity with the resin in step 60 in FIG. 4. The mold 32 is cleaned in step 61. After the mold 32 is cleaned, the preheated semiconductor assembly 10 is set in the lower mold 36 (step 62).

The support pins 42 are then raised by the rod 46 and the connecting material 44 by driving the servomotor 48 to rotate the front cam 50. The upper ends of the support pins 42 come in contact with the bottom of the die pad 14 of the semiconductor assembly 10 to support the semiconductor assembly 10 as shown in FIG. 1 (step 63). At this time, the vertical position of the support pins 42 is detected by a position sensor (not shown) to provide a signal to a controller (not shown), and then the semiconductor assembly 10 is pushed slightly upward from the previous position shown by the dot-dot-dash line in FIG. 1 by the support pins 42 moved by the servomoter 48 controlled by the controller. If the thickness "t" of the semiconductor device sealed with the resin is 1 mm, the semiconductor assembly 10 is moved 0.08 to 0.2 mm upward from the previous position of the contact portion of the support pins 42. Since the die pad 14 is pressed against the support pins 42 by the elasticity of the suspension leads which connect the die pad 14 to the frame and the wires 22, the semiconductor assembly 10 is not pushed up by the flow of the resin even if the molding resin is injected from the mold gate 54 formed in the lower mold 36 under high pressure.

The upper mold 34 is then lowered to close the mold 32 (step 64). The mold may be closed before the support pins 42 come in contact with the semiconductor assembly 10. If the mold is closed before the support pins 42 come in contact with the semiconductor assembly 10, the semiconductor assembly 10 does not tilt or become out of position when the support pins 42 come in contact with the semiconductor assembly 10.

After the mold is closed, the molding resin is injected into the cavity 38 through the mold gate 54 (step 65). In this embodiment, the molding resin is adjusted to be cured within about 180 seconds. After the resin is injected into the cavity 38, the servomotor 48 is reversed at an appropriate time to pull the support pin 42 into the lower mold 36 while applying pressure to the resin in the cavity 38 (step 66). In this embodiment, the support pins 42 are pulled into the mold after 12 seconds have elapsed from the completion of the resin injection. The pulling rate of the support pins 42 is controlled so as not to form bubbles in the resin. When the support pins 42 are pulled into the lower mold 36, the resin flows into the space which the support pins 42 have occupied, to fill the space.

Pressure is continuously applied to the resin in the cavity 38 until the resin is cured (step 67). After the resin is cured, the mold 32 is opened in a step 68 and the semiconductor assembly 10 is pushed up using an ejector pin provided in the lower mold 36 and removed from the mold 32 (step 69). The semiconductor assembly 10 removed from the mold 32 is conveyed to the next step (step 70).

In this embodiment, since the resin is injected into the cavity 38 while supporting the semiconductor assembly 10 with the support pins 42 which are in contact with the bottom of the die pad 14, the semiconductor assembly 10 does not tilt or is not drawn down by the flow of the resin. Moreover, since the semiconductor assembly 10 is slightly pressed upward from the previous position of the contact portion of the support pins 42, the pressure prevents the semiconductor assembly 10 from floating up by the flow of the resin. Therefore, defects such as exposure of the die pad 14 or wires 22 can be eliminated.

In this embodiment, since the support pins 42 are actuated by the servomotor 48, height of the projected support pins 42, operation rate, operation method, and the like can be optionally set, whereby conditions suitable for various packages can be set. Moreover, since the movement of the semiconductor assembly by the flow of the resin can be prevented in this embodiment, adjustment of the molding conditions is not needed, whereby processability of the molding step can be improved.

In this embodiment, although a pair of support pins 42 is provided, one or three support pins 42 may be used. If only one support pin 42 is used, it is preferable that the support pin 42 support the center of the die pad 14. In this case, the semiconductor assembly 10 can be supported more stably by providing a support pin having an elliptical top surface in which a diameter in a direction of the axis 56 of the mold gate 54 is longer. In this embodiment, although the servomotor 48 is used as an actuator, a cylinder or the like may be used instead.

Figure 5:
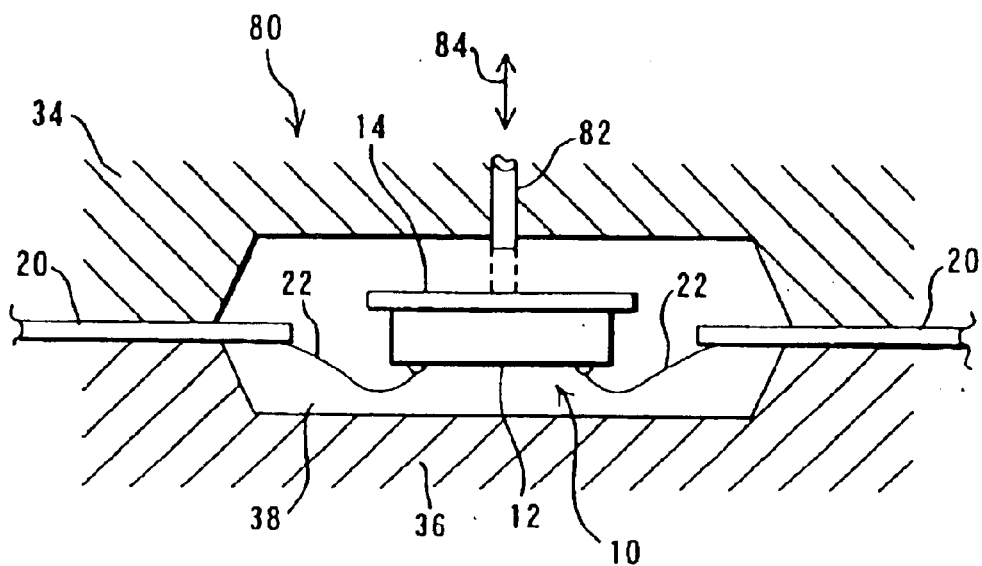
FIG. 5 illustrates the molding device according to the second embodiment of the present invention.

FIG. 5 illustrates the second embodiment. A support pin 82 is provided on the upper mold 34 in a molding device 80. A support pin 82 is arranged so as to be able to enter into or be pulled out of the upper mold 34 as shown by an arrow 84, and come in contact with an upper surface of the die pad 14 of the semiconductor assembly 10 that is placed in the cavity 38. The semiconductor chip 12 is provided on a lower surface of the die pad 14.

In the second embodiment constituted in this manner, the same effects as in the above embodiment can be obtained by injecting the molding resin into the cavity 38 while supporting the die pad 14 of the semiconductor assembly 10 with the semiconductor chip 12 on the lower surface by the support pin 82. In this embodiment, a plurality of support pins 82 may be used instead.

Figure 6:
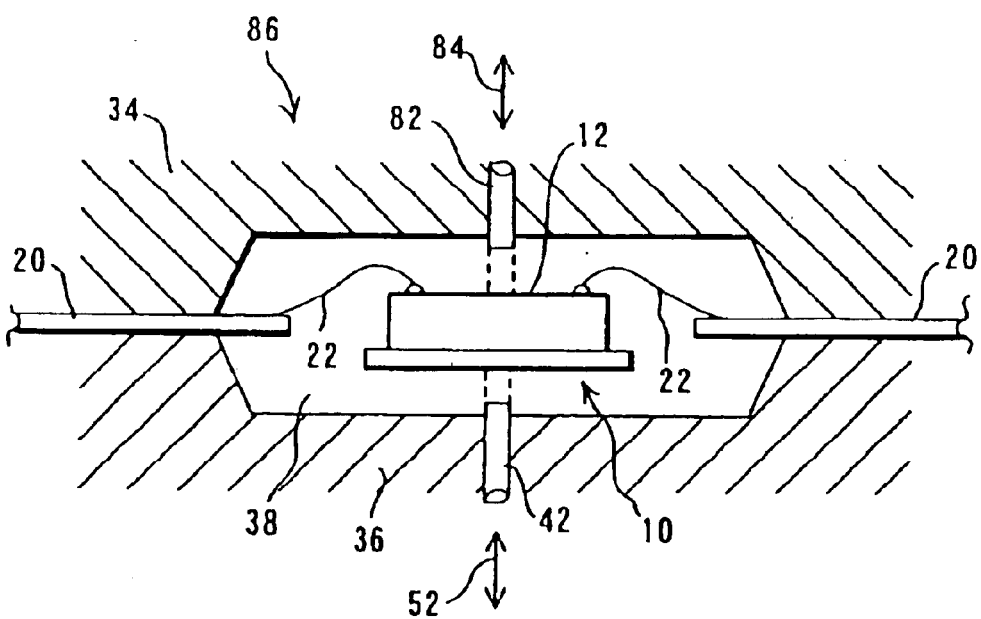
FIG. 6 illustrates the third embodiment of the present invention.

FIG. 6 illustrates a third embodiment of the present invention. In a molding device 86 according to this embodiment, the support pins 82 and 42 are provided on the upper mold 34 and the lower mold 36, respectively, to support the top and bottom of the semiconductor assembly 10 placed in the cavity 38. In this embodiment, since the support pins 82 and 42 support the top and bottom of the semiconductor assembly 10, movement of the semiconductor assembly 10 due to the flow of the injected resin can be completely eliminated.

Figure 7:
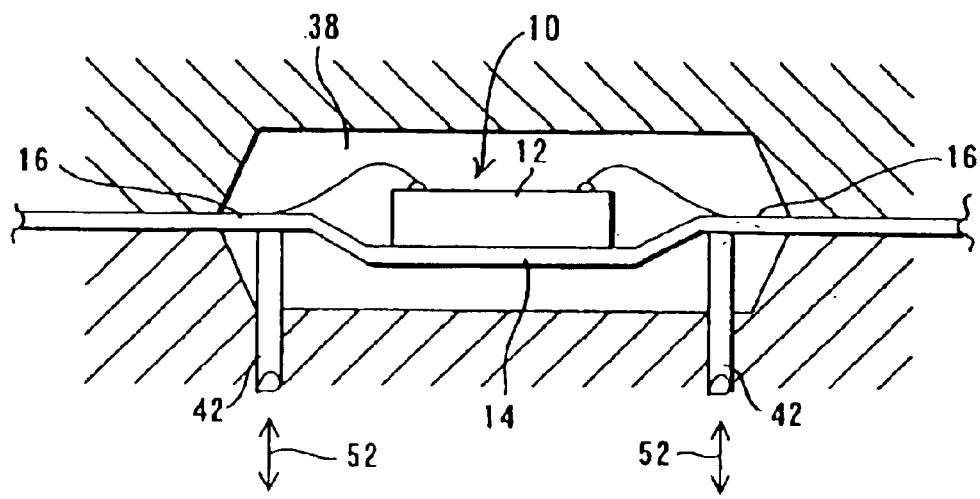
FIG. 7 illustrates the fourth embodiment of the present invention.

FIG. 7 shows a fourth embodiment of the present invention. In the fourth embodiment, a pair of support pins 42 is provided so as to be able to enter into or be pulled out of the lower mold 36. These support pins 42 are provided at a position corresponding to the suspension leads 16 which connect the die pad 14 to the lead frame. The support pins 42 come in contact with the lower surfaces of the suspension leads 16 to support the semiconductor assembly 10. The suspension leads 16 to be in contact with the support pins 42 are provided at a corner of the die pad 14 corresponding to the mold gate and also at the opposite corner. In the fourth embodiment, since the suspension leads 16 to be supported are positioned at the facing corners of the die pad 14, the interval "p" between the support pins 42 can be made relatively large, whereby the semiconductor assembly 10 can be supported more stably.

Figure 8:
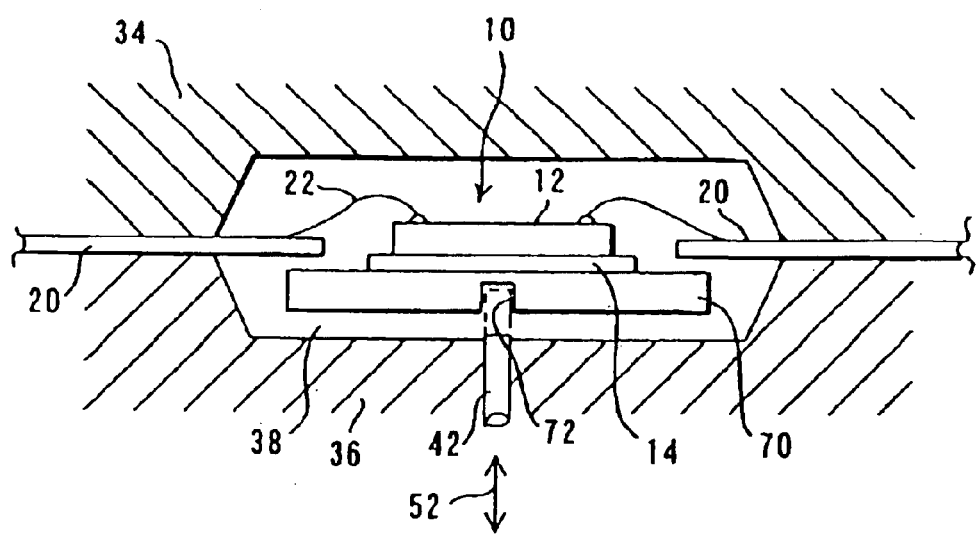
FIG. 8 illustrates the fifth embodiment of the present invention.
Figure 9:
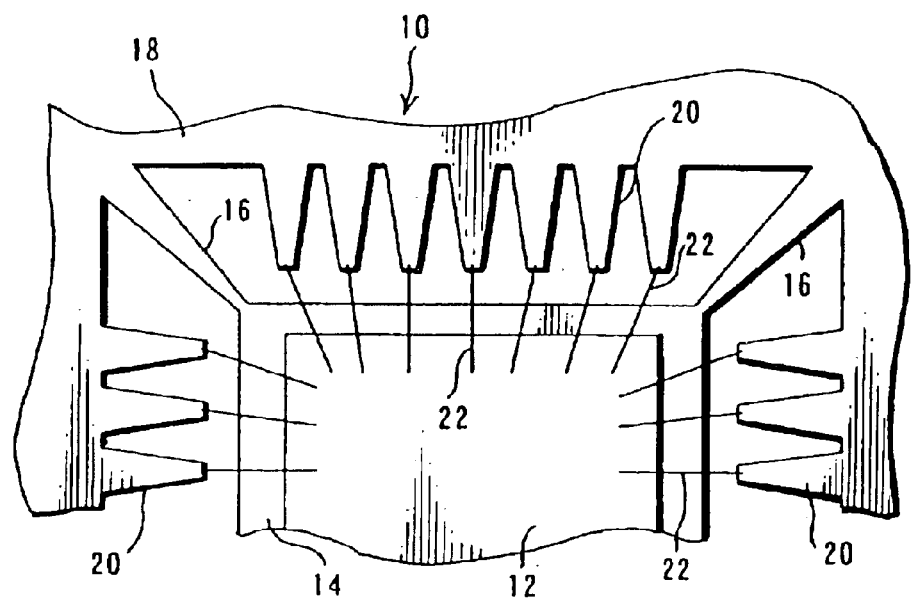
FIG. 9 is a plan view showing part of a semiconductor assembly.
Figure 10:
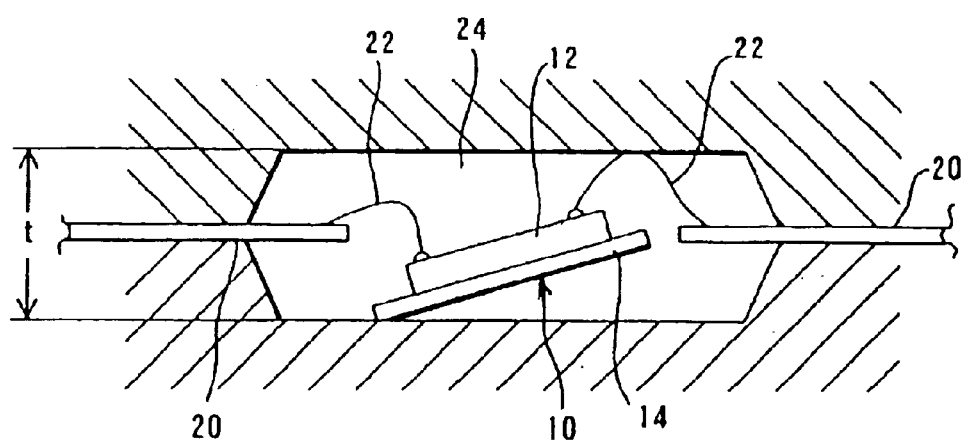
FIG. 10 illustrates a conventional method of manufacturing a semiconductor device.

FIG. 8 shows a fifth embodiment of the present invention. In this embodiment, a semiconductor device having a heat sink is manufactured. A heat radiator 70 is disposed in the cavity 38 of the lower mold 36 and supported by the support pin 42 as shown by the broken line in FIG. 8. A recess 72 is formed in the center of the bottom of the heat radiator 70 for preventing mispositioning. The upper end of the support pin 42 is secured in the recess 72 to support the heat radiator 70.

The semiconductor assembly 10 is placed on the upper side of the heat radiator 70 supported by the support pin 42. After the semiconductor assembly 10 is disposed, the upper mold 34 is closed and the resin is injected into the cavity 38. After the resin is injected, the support pin 42 is pulled into the lower mold 36 at an appropriate time as shown by the solid line in FIG. 8, and the resin is cured as described.

In this embodiment, the heat radiator 70 can be provided to the semiconductor assembly 10 when sealing with the resin, thereby simplifying the manufacturing process. Moreover, since the support pin 42 is secured in the recess 72, the heat radiator 70 is not out of position nor does it fall off the support pin 42 when the semiconductor assembly 10 is placed on the heat radiator 70. Therefore, the heat radiator 70 and the semiconductor assembly 10 can be precisely positioned. In this embodiment, a plurality of support pins 42 may be provided.

What is claimed is:

1. A method of manufacturing a semiconductor device comprising:
    placing a semiconductor assembly in which a semiconductor chip is secured to a die pad of a lead frame in a cavity of a mold;
    applying a pressure in only one direction to the semiconductor assembly by at least one support pin so as to cause a stress in the lead frame;
    sealing the semiconductor assembly with a resin injected into the cavity from a resin injection port of the mold, the stress caused in the lead frame preventing the semiconductor assembly from being lifted up or pushed down by the resin when the resin is injected into the cavity; and
    pulling the support pin from the cavity into the mold before the resin is cured to release the semiconductor assembly from the pressure applied by the support pin.

2. The method of manufacturing a semiconductor device as defined in claim 1, wherein the support pin is caused to come in contact with the die pad of the semiconductor assembly.

3. The method of manufacturing a semiconductor device as defined in claim 2, wherein a plurality of the support pins are arranged substantially on the axis of the resin injection port.

4. The method of manufacturing a semiconductor device as defined in claim 2,
    wherein the semiconductor assembly is placed in the cavity with the die pad provided on the lower side.

5. The method of manufacturing a semiconductor device as defined in claim 2,
    wherein the semiconductor assembly is placed in the cavity with the die pad provided on the upper side.

6. The method of manufacturing a semiconductor device as defined in claim 1, wherein a plurality of the support pins are arranged substantially on the axis of the resin injection port.

7. The method of manufacturing a semiconductor device as defined in claim 1,
    wherein the semiconductor assembly is pushed by the support pin in a direction away from the previous position of the contact portion of a support pin.

8. The method of manufacturing a semiconductor device as defined in claim 7,
    wherein the semiconductor assembly is placed in the cavity with the die pad provided on the lower side.

9. The method of manufacturing a semiconductor device as defined in claim 7,
    wherein the semiconductor assembly is placed in the cavity with the die pad provided on the upper side.

10. A semiconductor device manufactured by the method as defined in claim 1.

11. A method of manufacturing a semiconductor device comprising:
    placing a semiconductor assembly in which a semiconductor chip is secured to a die pad of a lead frame in a cavity of a mold;
    applying a pressure to the semiconductor assembly by at least one support pin so as to cause a stress in the lead frame;
    sealing the semiconductor assembly with a resin injected into the cavity from a resin injection port of the mold, the pressure applied by the at lease one support pin preventing the semiconductor assembly from being lifted up or pushed down by the resin when the resin is injected into the cavity; and
    pulling the support pin from the cavity into the mold before the resin is cured to release the semiconductor assembly from the pressure applied by the support pin,
    wherein the support pins is caused to come in contact with a suspension lead that connects the die pad to a frame of the lead frame.

12. A method of manufacturing a semiconductor device comprising the steps of:
    supporting a heat radiator placed in a cavity of a mold with at least one support pin;
    placing a die pad of a lead frame to which a semiconductor chip is secured on the heat radiator;
    closing the mold;
    applying a pressure in only one direction to the heat radiator by at least one support pin so as to cause a stress in the lead frame;
    injecting a resin into the cavity from a resin injection port, the stress caused in the lead frame preventing the heat radiator from being lifted up or pushed down by the resin when the resin is injected into the cavity; and
    pulling the support pin from the cavity into the mold before the resin is cured to release the heat radiator from the pressure applied by the support pin.

13. The method of manufacturing a semiconductor device as defined in claim 12,
    wherein a recess for preventing mispositioning is formed on a lower surface of the heat radiator and the heat radiator is supported by the support pin in the recess.

14. The method of manufacturing a semiconductor device as defined in claim 12, wherein a plurality of the support pins are arranged substantially on the axis of the resin injection port.

15. A semiconductor device manufactured by the method as defined in claim 12.

16. A molding device for a semiconductor device comprising:
    a mold which is capable of being opened or closed and is provided with a cavity for placing a semiconductor assembly which comprises a semiconductor chip secured to a die pad of a lead frame;
    a resin injection port provided to the mold for injecting a resin into the cavity;
    at least one support pin provided in the cavity such that the support pin is able to enter into or be pulled out of the cavity to come in contact with the semiconductor assembly in the cavity; and an actuator which moves the support pin in a direction of the axis of the support pin such that during injecting the resin into the cavity the support pin applies a pressure in only one direction to the semiconductor assembly so as to cause a stress in the lead frame, the stress caused in the lead frame preventing the semiconductor assembly from being lifted up or pushed down by the resin when the resin is injected into the cavity, and such that the support pin releases the semiconductor assembly from the pressure applied by the support pin after the resin is injected before the resin is cured.

17. The molding device for a semiconductor device as defined in claim 16, wherein a plurality of the support pins are arranged substantially on the axis of the resin injection port.

18. The molding device for a semiconductor device as defined in claim 16, wherein the mold consists of an upper mold and a lower mold which together form the cavity, and the support pin in provided in the lower mold.

19. The molding device for a semiconductor device as defined in claim 18, wherein the support pin is provided at a position corresponding to the die pad of the semiconductor assembly placed in the cavity.

20. The method of manufacturing a semiconductor device as defined in claim 18, wherein the actuator is a servomotor.

21. The molding device for a semiconductor device as defined in claim 16, wherein the mold consists of an upper mold and a lower mold which together form the cavity, and the support pin is provided in the upper mold.

22. The molding device for a semiconductor device as defined in claim 21, wherein the support pin is provided at a position corresponding to the die pad of the semiconductor assembly placed in the cavity.

23. The method of manufacturing a semiconductor device as defined in claim 21, wherein the actuator is a servomotor.

24. The molding device for a semiconductor device as defined in claim 16, wherein the support pin is provided at a position corresponding to the die pad of the semiconductor assembly placed in the cavity.

25. The method of manufacturing a semiconductor device as defined in claim 16, wherein the actuator is a servomotor.

26. A molding device for a semiconductor device comprising:

a mold which is capable of being opened or closed and is provided with a cavity for placing a semiconductor assembly which comprises a semiconductor chip secured to a die pad of a lead frame;

a resin injection port provided to the mold for injecting a resin into the cavity;

at least one support pin provided in the cavity such that the support pin is able to enter into or be pulled out of the cavity to come in contact with the semiconductor assembly in the cavity; and an actuator which moves the support pin in a direction of the axis of the support pin such that during injecting the resin into the cavity the support pin applies a pressure to the semiconductor assembly so as to cause a stress in the lead frame, the pressure applied by the at least one support pin preventing the semiconductor assembly from being lifted up or pushed down by the resin when the resin is injected into the cavity, and such that the support pin releases the semiconductor assembly from the pressure applied by the support pin after the resin is injected before the resin is cured, wherein the support pin is provided substantially on the axis of the resin injection port; and wherein the support pin is placed at a position corresponding to suspension leads which connect the die pad to a frame of the lead frame.

* * * * *